United States Patent [19]

Tanaka

[11] Patent Number: 5,200,356

[45] Date of Patent: Apr. 6, 1993

[54] METHOD OF FORMING A STATIC RANDOM ACCESS MEMORY DEVICE

[75] Inventor: Kenichi Tanaka, Nara, Japan

[73] Assignee: Sharp Kabushiki Kaisha, Osaka, Japan

[21] Appl. No.: 682,652

[22] Filed: Apr. 9, 1991

Related U.S. Application Data

[62] Division of Ser. No. 385,074, Jul. 26, 1989, abandoned.

[30] Foreign Application Priority Data

Jul. 29, 1988 [JP] Japan .................. 63-190808

[51] Int. Cl.⁵ .............................................. H01L 21/70
[52] U.S. Cl. ......................................... 437/60; 437/52; 437/47; 437/918
[58] Field of Search .................. 437/60, 52, 47, 918, 437/48-50; 148/DIG. 136; 357/51

[56] References Cited

U.S. PATENT DOCUMENTS

| 4,774,203 | 9/1988 | Ikeda et al. | 437/60 |
| 4,868,537 | 9/1989 | Blanchard | 357/51 |
| 4,950,620 | 8/1990 | Harrington, III | 437/60 |
| 5,013,686 | 5/1991 | Choi et al. | 437/194 |
| 5,049,970 | 9/1991 | Tanaka et al. | 357/51 |

FOREIGN PATENT DOCUMENTS

| 0083256 | 6/1980 | Japan | 437/60 |
| 0043749 | 4/1981 | Japan | 437/918 |
| 0120549 | 6/1985 | Japan | 437/60 |
| 0130552 | 5/1989 | Japan | 357/51 |

Primary Examiner—Brian E. Hearn
Assistant Examiner—Michael Trinh

[57] ABSTRACT

A static random access memory device includes memory cells each having four MOS transistors and two load resistors which form a flip-flop circuit. The load resistor is formed by ion implantation of impurities in a predetermined region of an oxide film which is an extension of a gate insulating film of the MOS transistor. A power supply interconnection is connected to a surface of the load resistor. The word line and power supply interconnection are formed of a stacked structure having a polysilicon layer and a high melting metal silicide layer.

5 Claims, 4 Drawing Sheets

METHOD OF FORMING A STATIC RANDOM ACCESS MEMORY DEVICE

This application is a divisional of copending application Ser. No. 07/385,074, filed on July 26, 1989, now abandoned. The entire contents of which are hereby incorporated by reference.

BACKGROUND OF THE INVENTION

1. Field of the Invention

The present invention relates to a static random access memory device, and more particularly, to a highly integrated structure of a memory cell in a static random access memory which includes load resistors of high resistance.

2. Description of the Background Art

The outstanding development of information equipment such as computers has made higher requirements necessary for the semiconductor memory devices used in the equipment. Particularly, the demand for semiconductor memory devices with large-scale storage capacity has increased and technological research and development directed to higher speed and more highly integrated devices has been promoted intensively.

An example of such a semiconductor memory device is a Static Random Access Memory (referred to as SRAM hereinafter). In the SRAM, a memory cell which stores memory information includes four to six MOS (Metal Oxide Semiconductor) transistors. A conventional type of memory cell in which MOS transistors are interconnected to constitute a flip-flop circuit is generally known. The SRAM has also been highly integrated to have an enhanced storage capacity, which has resulted in a load resistor-type SRAM suited for integration.

FIG. 4 illustrates an equivalent circuit diagram of a memory cell in a SRAM using load resistors. In reference to the diagram, a memory cell includes four MOS transistors and two load resistors. The four MOS transistors include two drive transistors 2a and 2b and two transfer transistors 3a and 3b. The drive transistor 2a has a gate electrode connected to a drain electrode of the drive transistor 2b and a drain electrode connected to a gate electrode of the transistor 2b. Furthermore, two load resistors 4a and 4b are connected to the drain electrodes of the transistors 2a and 2b, respectively. The gate electrodes of the transfer transistors 3a and 3b are connected to a word line 5. One source/drain electrode of the transfer transistor 3a is connected to a bit line 6a and one source/drain electrode of the transfer transistor 3b is connected to a bit line 6b. Meanwhile, the other ends of the load resistors 4a and 4b are connected to the supply voltage Vcc.

A sectional structure of the above mentioned memory cell will be described next. FIGS. 5A to 5E are sectional views of the memory cell 1 in the regular sequence of a manufacturing process, wherein a drive transistor 2a, a load resistor 4a and so forth are typically illustrated.

First, as illustrated in FIG. 5A, a field oxide film 8 is formed in a predetermined region of a surface of a silicon substrate 7 by the selective oxidation method. A gate oxide film 9 is then formed on a surface of the silicon substrate 7 by a thermal oxidation method. Furthermore, after impurities for adjusting the threshold voltage are ion-implanted into a surface of the silicon substrate 7, a polysilicon layer 10 is deposited by a CVD (Chemical Vapor Deposition). Subsequently, a high melting metal film 11, such as tungsten (W), is deposited thereon by CVD.

Secondly, as illustrated in FIG. 5B, the high melting metal film 11 and the polysilicon layer 10 are patterned to exhibit a predetermined configuration by photolithography and etching steps. A gate electrode 12 of the drive transistor 2a is formed through this process. Source and drain regions 13 are then formed by ion implantation of impurities in surface regions of the silicon substrate 7 using the gate electrode 12 as a mask. Thereafter, an oxide film 14 is deposited on the surface of the silicon substrate 7 by CVD.

Furthermore, as illustrated in FIG. 5C, a contact hole 15 is formed in the oxide film 14 by photolithography technique and etching is performed to reach the impurity region 13. A second polysilicon layer 16 is in turn deposted on an inner surface of the contact hole 15 and the remaining surfaces by the CVD. In addition, a very small amount of impurities is introduced into the second polysilicon layer 16 by ion implantation. The second polysilicon layer 16 becomes a conductive layer with a high resistance through this process.

Next, as illustrated in FIG. 5D, impurities having a high density are introduced by ion implantation into an area of the second polysilicon layer 16 deposited on the impurity region 13 so that the resistance of that area will be reduced. Thus, an interconnection region 17 is formed in the area of the second polysilicon layer 16 which includes impurities of high density. Meanwhile, a remaining area of the second polysilicon layer 16 has a very small amount of impurities introduced by ion implantation in order to constitute a load resistor 4a.

As illustrated in FIG. 5E, the second polysilicon layer 16 is then patterned to have an interconnection layer 17 and a load resistor 4a of a predetermined configuration by photolithography and etching steps. A silicon oxide film 18 is in turn deposited by CVD, and a BPSG (Boro Phospho Silicate Glass) film 19 is further deposited by CVD> A contact hole 20 is then formed in the BPSG film 19 and the silicon oxide film 18 to reach the impurity region 13 Thereafter, an interconnection layer 21, such as aluminum, is deposited in this contact hole 20. Finally, the entire surface is coated with a passivation film (not shown) which completes the manufacturing process of the memory cells.

In the foregoing description, a conventional SRAM is formed with load resistors having a polysilicon layer of high resistance. In addition, the illustrated structure is characterized by forming a so-called double layer polysilicon structure having a polysilicon layer which forms a gate electrode 12 with a polysilicon layer which forms a load resistor stacked thereon.

In order to enhance the high speed operation characteristics of a highly integrated SRAM, it becomes increasingly necessary to reduce the interconnection resistance thereof. Additionally, memory cells of a SRAM as manufactured according to the above mentioned manufacturing process need at least three photolithography processes to form load resistors during the manufacturing process. This process includes complicated processing steps, such as a pattern mask formation process, a mask alignment process, or an exposure and development process. Therefore, as the number of photolithography processes is increased, the entire manufacturing process of memory cells becomes more and more complicated. In addition, the manufacturing process of a load resistor 4a includes patterning a polysilicon layer and ions selectively implanting into the polysilicon layer with different densities. Moreover, this process is performed as an independent process to form a load resistor. Accordingly, the total number of processes included in the manufacturing process is increased. The SRAM requiring such complicated manufacturing processes has encountered difficulties, especially in the case where the SRAM is formed on one chip and combined with a CPU (Central Processing Unit) and other memories in an ASIC (Applied Specification Integrated Circuit).

SUMMARY OF THE INVENTION

An objected of the present invention is to improve the high speed operation characteristics of a SRAM.

Another object of the present invention is to reduce the interconnection resistance of memory cells in a SRAM.

Still another object of the present invention is to simplify the structure of load resistors of a memory cell in a SRAM.

A further object of the present invention is to provide a SRAM which includes memory cells having miniaturized load resistors A memory cell in a SRAM according to the present invention includes switching elements and load resistors. A switching element includes a pair of impurity regions formed in a semiconductor substrate, a gate insulating film formed on a surface of the semiconductor substrate and a first conductive layer formed on a surface of the gate insulating film. A load resistor is formed by introducing impurities in the insulating film formed on a surface of the semiconductor substrate. The load resistor is connected to one of the impurity regions of the switching element. Furthermore, the load resistor is connected to a second conductive layer. The second conductive layer and the first conductive layer of the switching element form a double layer structure having a polycrystalline silicon layer and a high melting metal silicide layer formed thereon.

According to an embodiment of the present invention, a memory cell of a SRAM includes four MOS transistors and two load resistors which constitute a flip-flop circuit as a whole. Word lines, gate electrodes of the MOS transistors and power interconnections connected to load resistors are all formed of a double layer structure having a polycrystalline silicon layer and a high melting metal silicide layer.

The interconnection resistance of an interconnection layer formed of the double layer structure can be reduced because the high melting metal silicide layer thereof has a high conductivity.

A load resistor formed of an insulating film including impurities can be readily manufactured. Also, patterning of the device arrangement thereof is easy so that the structure of a memory cell in a SRAM will be simplified.

The foregoing and other objects, features, aspects and advantages of the present invention will become more apparent from the following detailed description of the present invention when taken in conjunction with the accompanying drawings.

BRIEF DESCRIPTION OF THE DRAWINGS

The present invention will become more fully understood from the detail description given hereinbelow and the accompanying drawings which are given by way of illustration only, and thus are not limitative of the present invention, and wherein.

DESCRIPTION OF THE PREFERRED EMBODIMENTS

An embodiment of the present invention will be described as follows with reference to the accompanying drawings.

Figure 1:
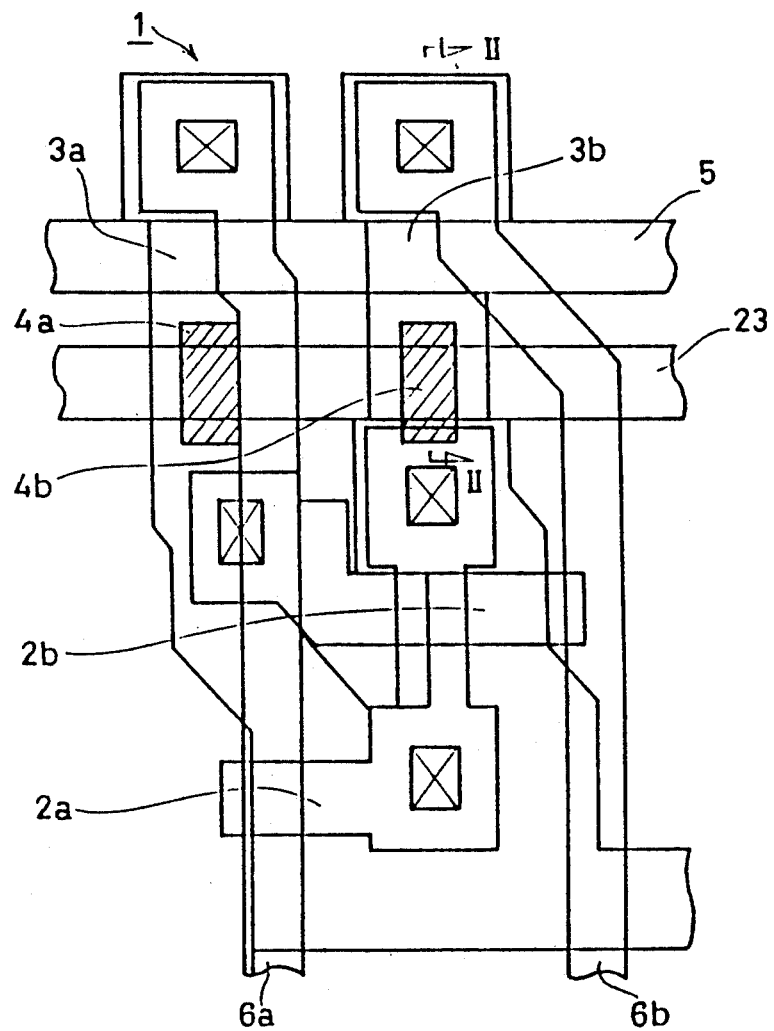
FIG. 1 is a plan view of a memory cell in a SRAM according to an embodiment of the present invention.
Figure 2:
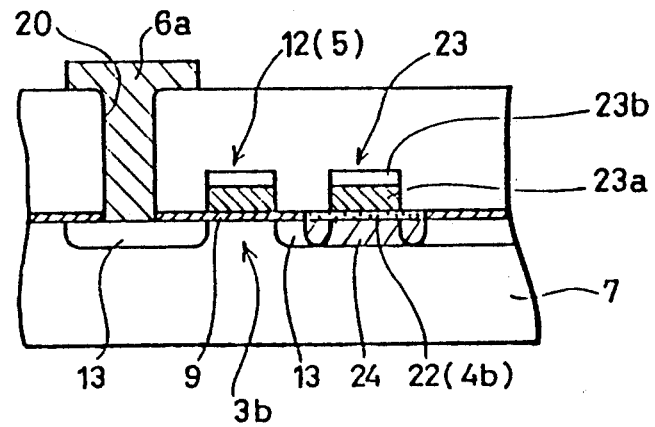
FIG. 2 is a sectional view of the memory cell along the line II—II in FIG. 1.
Figure 4:
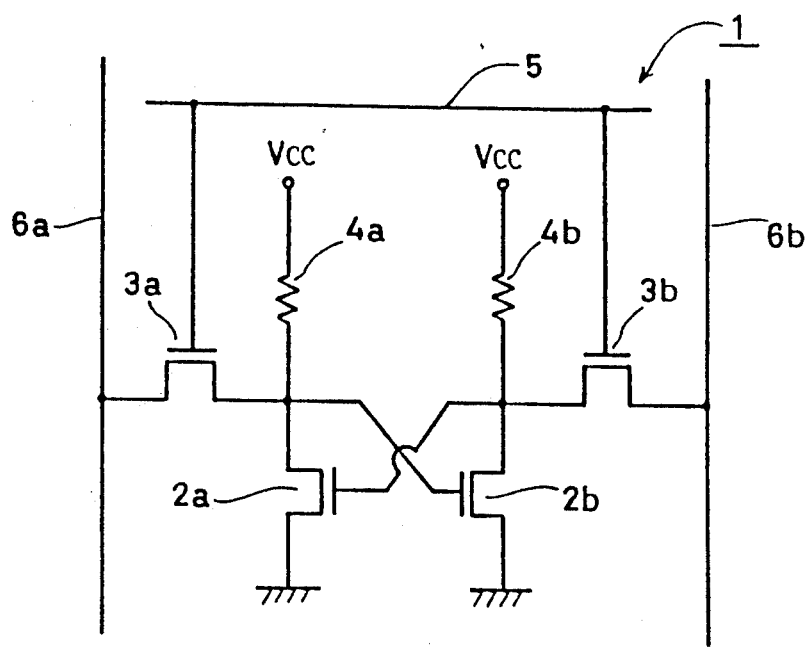
FIG. 4 is a general equivalent circuit diagram of a memory cell in a SRAM having load resistors.
Figure 5A:
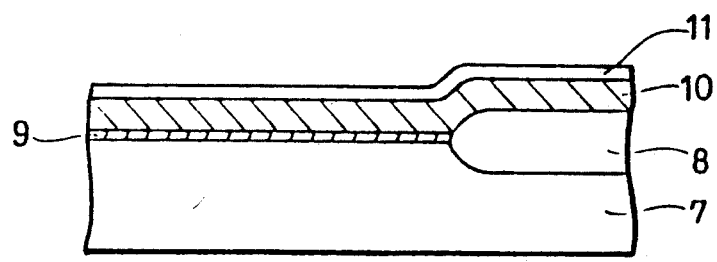
FIGS. 5A, 5B, 5C, 5D and 5E are sectional views of a memory cell in a conventional SRAM illustrating the regular sequence of the manufacturing process.
Figure 5B:
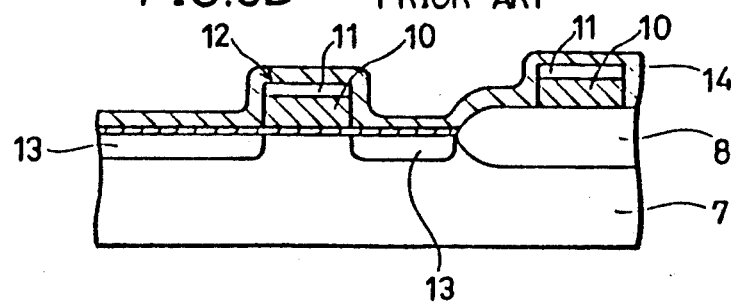
Figure 5C:
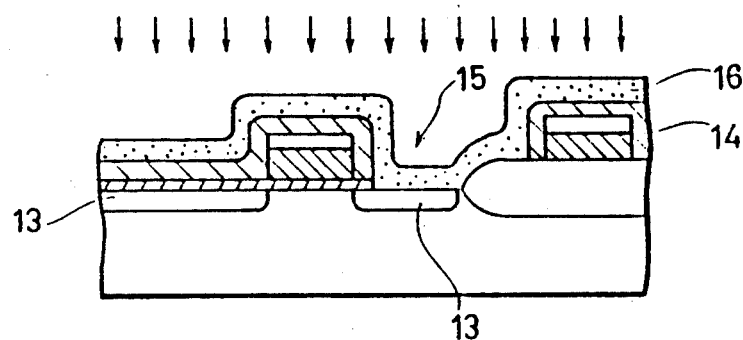
Figure 5D:
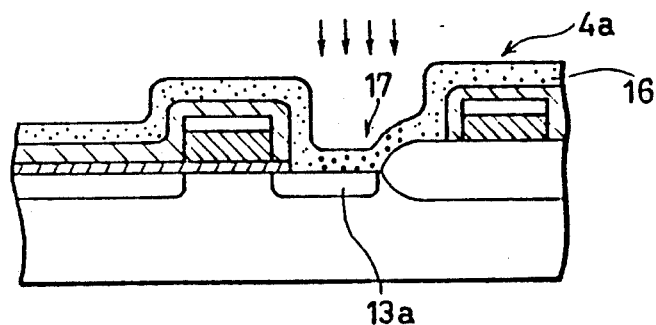
Figure 5E:
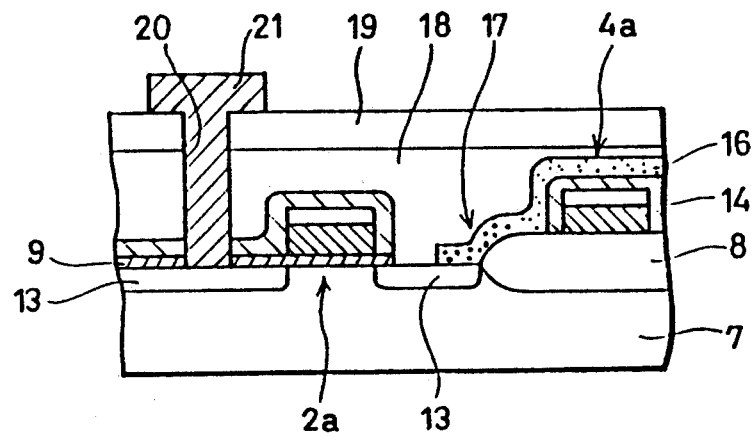

In FIGS. 1, 2 and 4, one of the characteristics of the present embodiment is that an oxide film region 22 formed on a surface of a silicon substrate 7 is used to constitute resistors 4a and 4b of a memory cell for a SRAM. The oxide film region 22 has impurities of a high density introduced therein to obtain conductivity. A Vcc line 23 for connection with a supply voltage is connected to a surface of the oxide film region 22 which serves as a load resistor. The Vcc line 23 is formed of a stacked structure having a polysilicon layer 23a and a high melting metal silicide layer 23b. In addition, a conductive layer 24 having impurities of a high density introduced therein is formed in a surface region of the silicon substrate 7 on which the oxide film region 22 is formed. As such, this conductive layer 24 overlaps with the two separate impurity regions from each of the transfer transistors 3a and 3b and drive transistors 2a and 2b so that the regions are rendered conductive to each other over the conductive layer 24. A gate electrode 12 for each of the transfer transistors 3a and 3b is formed to extend in parallel with the Vcc line 23 formed on a surface of the oxide film region which serves as a load resistor. This gate electrode constitutes a word line 5. In addition, the gate electrode 12 is formed of a stacked structure having a polysilicon layer and a high melting metal silicide layer. The impurity regions 13 for each of the transfer transistors 3a and 3b are connected to bit lines 6a and 6b, respectively, through a contact hole 20.

Therefore, in a memory cell of a SRAM according to the present embodiment, as illustrated in FIG. 2, a load transistor 22 is formed in an extended plane of a gate oxide film 9 for the transfer transistor 3b. In addition, a gate electrode 12 of the transfer transistor 3b and a Vcc line 23 connected to the load resistor 22 are formed of the same polycide structure in parallel to each other.

A structure of a SRAM similar to the present invention is disclosed in the U.S. Pat. application No. 272,662 filed by the inventor of the present application.

Turning to FIGS. 3A to 3E, a description will now be made for the manufacturing process of the memory cell according to the present embodiment.

Figure 3A:
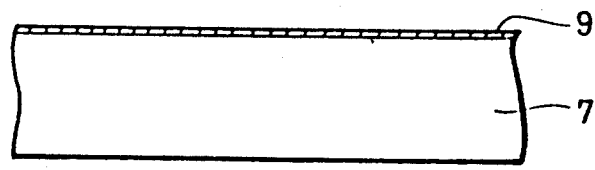
FIGS. 3A, 3B, 3C, 3D and 3E are sectional views illustrating a manufacturing process of the memory cell of the SRAM in FIGS. 1 and 2.

First, in FIG. 3A, a field oxide film (not shown) is formed in a predetermined region on a surface of a silicon substrate 7 by selective oxidation. A gate oxide film 9 is then allowed to grow to a thickness of about 200 to 300 Å on the surface of the silicon substrate 7 by thermal oxidation.

Figure 3B:
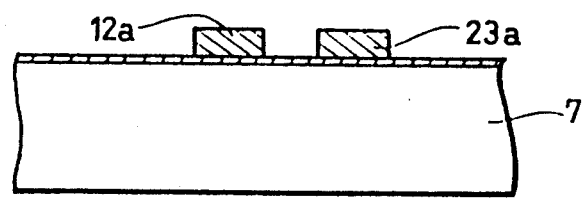

Secondly, as illustrated in FIG. 3B, a polysilicon layer is allowed to grow to a thickness of about 1000 to 2000 Å on a surface of the gate oxide film 9 by low pressure CVD. The thickness of this film may preferably be 1500 Å. Then, phosphorus (P) and the like is added to the polysilicon layer by thermal diffusion. This phosphorus addition process may be replaced, for example, by a process in which a doped polysilicon layer is deposited. Thereafter, the polysilicon layer is patterned by photolithography and etching to exhibit a predetermined configuration so that a polysilicon layer 12a having the gate electrode 12 of the transfer transistor 3b and a polysilicon layer 23a having the Vcc line 23 are formed.

Figure 3C:
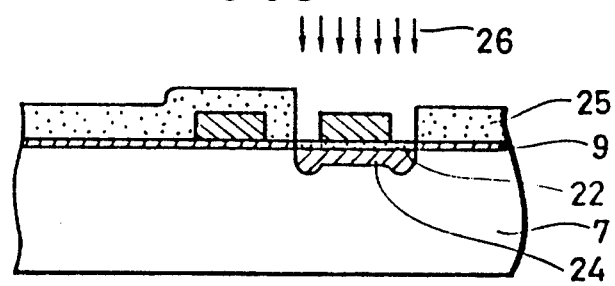

In addition, as illustrated in FIG. 3C, the surface of the silicon substrate 7 is coated with resist 25. The resist 25 is then patterned to exhibit a predetermined configuration which has an opening formed in a region where a load resistor should be formed. Then, impurity ions 26 of a high density, such as silicon (Si) ions or impurity ions such as phosphorus (P), are implanted in the surface of the silicon substrate 7 by using the resist 25 as mask. In this ion implantation process, the implantation energy should be set so that the density of the implanted impurities are the highest at the interface between the silicon substrate 7 and the gate oxide film 9. Through this ion implantation process, a conductive layer 24, which includes impurities of high density, is formed in a surface region of the silicon substrate 7. Meanwhile, a load resistor 22 is formed in the region of the gate oxide film 9 where impurities are implanted.

Figure 3D:
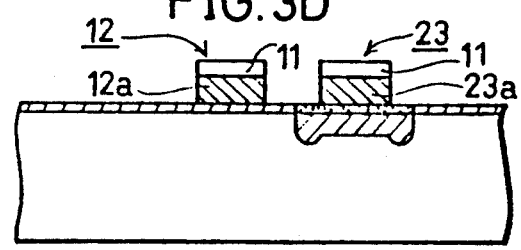

Furthermore, as illustrated in FIG. 3D, after the resist 25 is removed, a high melting metal film 11, such as tungsten, is deposited. Subsequently, the high melting metal film 11 is left only at the tops of the patterned polysilicon layers 12a and 23a. Additionally, in order to restore, for example, the surface of the silicon substrate 7 damaged in the preceding process of ion implantation, a heat treatment at 900° C. is performed for an hour. This permits the high melting metal films deposited on the polysilicon layers 12a and 23a to be silicidized. As a result, a stacked structure of polysilicon and silicide layers, i.e. a polycide structure, is formed in the gate electrode 12 and the Vcc line 23 so that the interconnection resistance thereof is reduced.

Figure 3E:
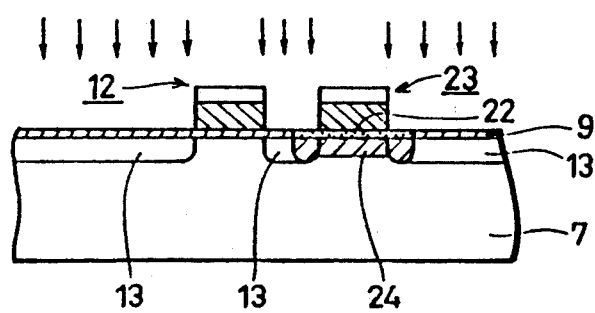

Thereafter, as illustrated in FIG. 3E, impurities are introduced in surface regions of the silicon substrate 7 by ionimplantation using the gate electrode 12 and the Vcc line 23 as masks. This permits impurity regions 13 of a drive transistor and a transfer transistor to be formed in the surface regions of the silicon substrate 7.

Finally, after formation of an interlayer insulating film and an interconnection layer, a passivation film is formed so that the manufacturing process of a memory cell is completed (not shown).

In the foregoing description, according to the present embodiment, load transistors formed of an oxide film can be manufactured in parallel with the manufacturing process of a MOS structure of drive transistors or transfer transistors Furthermore, a SRAM with load resistors as mentioned above can be formed through a general manufacturing process of MOS devices. Therefore, the SRAM may be easily manufactured without any specific manufacturing process even in a case where the SRAM should be manufactured on one chip and combined with a CPU and other memory devices As a result, the applicability of the SRAM is expanded. Additionally, a load resistor formed of a thin film structure, such as an oxide film, requires less area than in a case where a conventional polysilicon layer with a high resistance is used therefor, and the load resistor can be easily formed to exhibit almost any patterned configuration.

Furthermore, in the above mentioned embodiment, the electrode conductive layers of the gate electrode 12 (word line 5), the Vcc line 23 and so forth form a polycide structure. Because a high melting metal silicide has a higher conductivity than a conductive polysilicon layer, the interconnection resistance of the electrode conductive layers can be significantly reduced.

In the above-mentioned embodiment, a description has been made for a case in which a silicon oxide film is used as an insulating film which includes a load resistor 22. However, the SRAM is not intended to be only limited to such a case.

Although the present invention has been described and illustrated in detail, it is clearly understood that the description is by way of illustration and example only and is not to be taken by way of limitation. Therefore, the spirit and scope of the present invention is limited only by the terms of the appended claims.

I claim:

1. A claim method of forming an oxide film resistor for a static RAM device comprising the steps of:
   (a) forming an oxide film on a main surface of a semiconductor substrate having a first conductivity;
   (b) disposing a polycrystalline silicon layer on said oxide film after forming said oxide film in said step (a);
   (c) patterning said polycrystalline silicon layer in a first specified configuration after disposing said polycrystalline silicon layer in said step (b);
   (d) disposing a resist layer over said main surface of said semiconductor substrate and said polycrystalline silicon layer after patterning said polycrystalline silicon layer in said step (c);
   (e) patterning said resist layer in a second specified configuration which includes an opening in a specified region to a portion of said polycrystalline silicon layer after disposing said resist layer in said step (d);
   (f) ion-implanting silicon or impurities in said semiconductor substrate and said oxide film in the regions which fail to have said resist layer disposed thereon after patterning said resist layer in said step (e).

2. A method of forming an oxide film resistor according to claim 1, wherein said step (f) implants ions so that a maximum concentration of ions exists at boundaries between said oxide film and said semiconductor substrate.

3. A method of forming an oxide film resistor according to claim 1, further comprising the steps of:
   (g) forming a metal layer having a high melting point on the surface of said polycrystalline silicon layer; and
   (h) providing a heat treatment to silicidized said metal layer and activate the ions implanted in said semiconductor substrate.

4. A method of manufacturing a structure for a static RAM including a plurality of memory cells having load resistors, drive transistors and transfer transistors connected as a flip-flop circuit, comprising the steps of:
   (a) forming an oxide film on a main surface of a semiconductor substrate having a first conductivity;

(b) forming a polycrystalline silicon layer on a surface of said oxide film;
(c) patterning said polycrystalline silicon layer in a first specified configuration to form gate electrodes for each of said transfer transistors and upper electrodes connected to each of said load resistors;
(d) disposing a resist layer over said main surface of said semiconductor substrate and said polycrystalline silicon layer;
(e) patterning said resists layer in a second specified configuration having an opening in a specified region which includes a portion of said upper electrodes; and
(f) ion-implanting silicon or impurities in said semiconductor substrate and said oxide film in the regions which fail to have said resist layer disposed thereon;
(g) removing said resist layer; and
(h) ion-implanting impurities in said semiconductor substrate in the regions which fail to have said gate electrodes and said upper electrodes disposed thereon to form a plurality of impurity regions having a second conductivity.

5. A method of manufacturing a structure for a static RAM according to claim 4, further comprising the steps of:
(i) forming a metal layer having a high melting point over the surfaces of said gate and upper electrodes; and
(j) providing a heat treatment to silicidized said metal layer and activate the ions implanted in said semiconductor substrate.

* * * * *